US006777882B2

(12) United States Patent
Goldberg et al.

(10) Patent No.: US 6,777,882 B2
(45) Date of Patent: Aug. 17, 2004

(54) ION BEAM GENERATOR

(75) Inventors: Richard David Goldberg, Hove (GB); David George Armour, Bolton (GB); Christopher Burgess, Hove (GB)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/336,843

(22) Filed: Jan. 6, 2003

(65) Prior Publication Data

US 2003/0146707 A1 Aug. 7, 2003

(30) Foreign Application Priority Data

Jan. 11, 2002 (GB) ............................................. 0200616

(51) Int. Cl.[7] .................................................. H01J 7/24
(52) U.S. Cl. .............................. 315/111.81; 313/363.1; 250/492.21
(58) Field of Search ...................... 315/111.81, 111.01; 313/359.1, 360.1, 361.1, 363.1; 250/423 R, 492.21, 492.3

(56) References Cited

U.S. PATENT DOCUMENTS

| 4,447,773 | A | | 5/1984 | Aston ......................... 328/233 |
| 4,457,803 | A | | 7/1984 | Takigawa .................... 156/626 |
| 4,598,231 | A | | 7/1986 | Matsuda et al. ......... 375/111.81 |
| 4,980,556 | A | | 12/1990 | O'Connor et al. ...... 250/423 R |
| 5,343,047 | A | * | 8/1994 | Ono et al. .............. 250/492.21 |
| 5,780,863 | A | | 7/1998 | Benveniste et al. ..... 250/492.21 |
| 5,883,391 | A | * | 3/1999 | Adibi et al. ............ 250/492.21 |
| 5,932,882 | A | * | 8/1999 | England et al. ........ 250/492.21 |
| 5,969,366 | A | * | 10/1999 | England et al. ........ 250/492.21 |
| 6,130,436 | A | * | 10/2000 | Renau et al. ........... 250/492.21 |
| 6,242,750 | B1 | * | 6/2001 | Takahashi et al. ...... 250/492.21 |
| 6,489,622 | B1 | * | 12/2002 | Chen et al. ............. 250/492.21 |

FOREIGN PATENT DOCUMENTS

| EP | 0135366 | 3/1985 |
| EP | 1178517 | 2/2002 |
| GB | 2362027 | 11/2001 |
| JP | 58032346 | 2/1983 |
| JP | 04006740 | 1/1992 |
| JP | 080180829 | 7/1996 |
| JP | 10321151 | 12/1998 |
| WO | 9923685 | 5/1999 |
| WO | 0101438 | 1/2001 |

* cited by examiner

Primary Examiner—James Clinger
Assistant Examiner—Thuy Vinh Tran
(74) Attorney, Agent, or Firm—Boult Wade Tennant

(57) ABSTRACT

G2 electrode is mounted so as to be movable along the beam line and, optionally, perpendicular to it as well. G1 and G2 are curved with a constant gap between G1 and G2 in the radial direction (so that the two electrodes are concentric). This contrasts with the prior art where G1 and G2 were equidistantly spaced along the beam line direction instead. G1 is made re-entrant adjacent the slit so as to improve extraction efficiency from the plasma. Finally, a lens such as a quadrupole lens is formed downstream of G3.

22 Claims, 8 Drawing Sheets

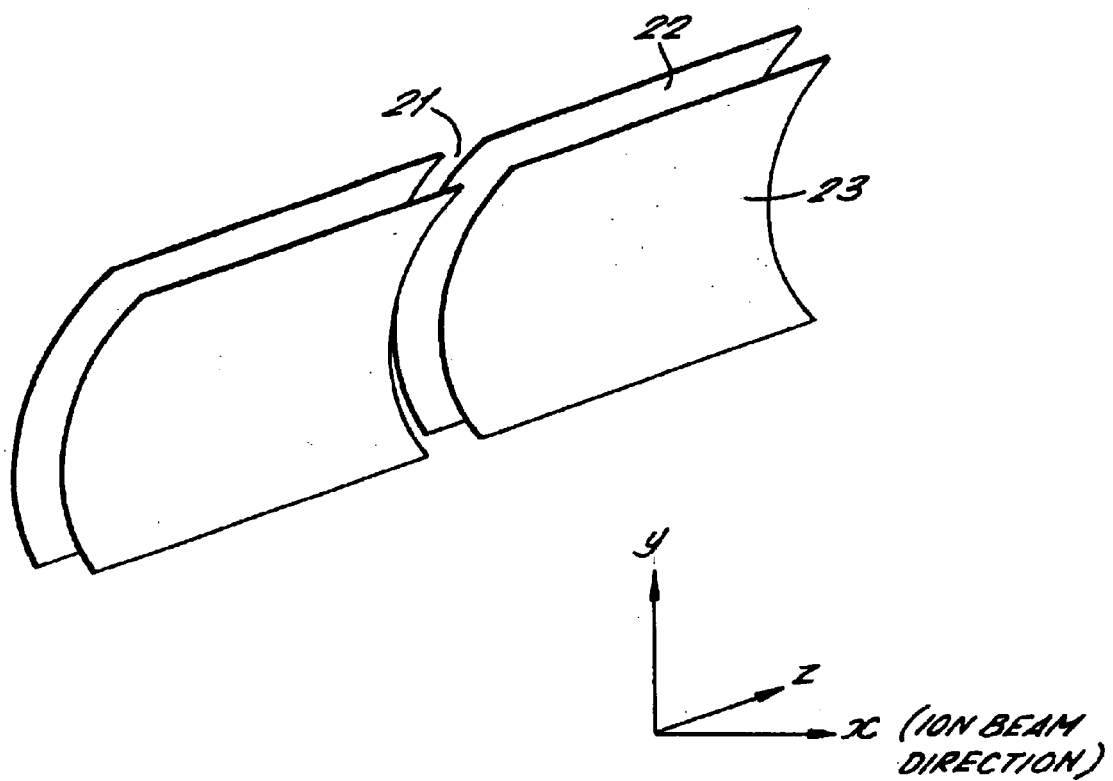

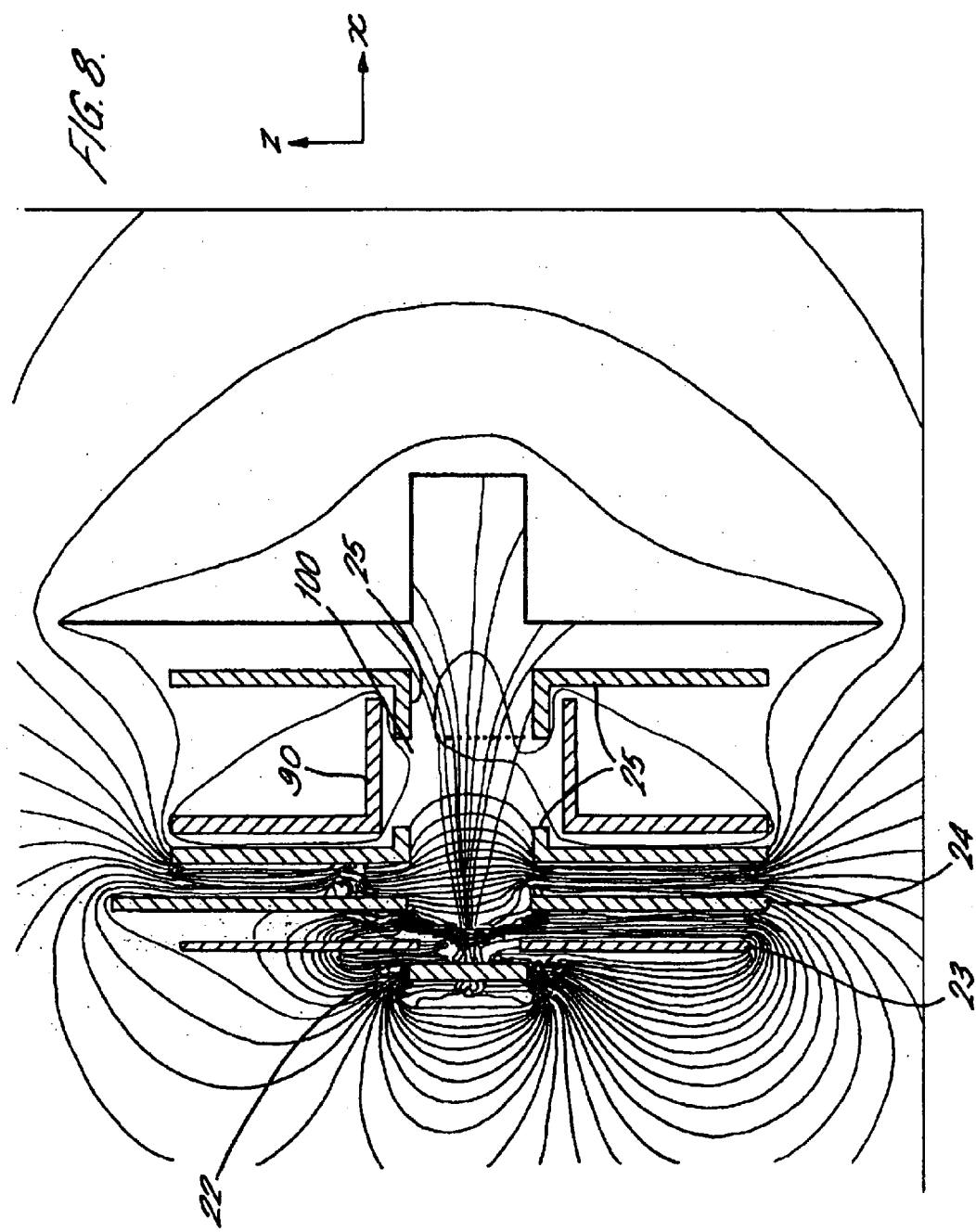

ION BEAM GENERATOR

FIELD OF THE INVENTION

This invention relates to an ion beam generator for an ion implantation system which permits the implanting of ions into substrates such as semiconductor wafers. More particularly, the invention relates to improvements in the extraction electrode assembly for such an ion beam generator.

BACKGROUND OF THE INVENTION

Ion implantation techniques for modifying the electrical conductivity properties of semiconductor materials are well known. In order to generate the ions necessary for implantation into the semiconductor wafer, an ion source is provided which generates ions of a chosen element. An extraction assembly comprising a plurality of electrodes is provided downstream of the ion source, to extract, accelerate and focus the ions before they enter a mass analyser and selector.

The traditional arrangement of electrodes in the extraction assembly is a so-called triode structure with three electrodes. More recently, a tetrode structure has been proposed with four sets of electrodes. This is set out in WO 99/23685.

There are several considerations in the extraction of ions from an ion source, such as beam tuning to optimise extraction efficiency, focussing of the beam and so forth. The present invention seeks to improve these and other factors.

SUMMARY OF THE INVENTION

According to a first aspect of the present invention, there is provided an ion beam generator for an ion implantation system, the ion beam generator comprising: an ion source for generating ions to be implanted; and an extraction electrode assembly comprising a plurality of electrodes for extracting and accelerating ions from the ion source; the extraction assembly-including a source electrode at the potential of the ion source, an extraction electrode adjacent to the source electrode to extract ions from the ion source along a first ion extraction axis, and a ground electrode downstream of the extract ion electrode in the said ion extraction direction; wherein the source electrode and the extraction electrode each have a curved portion adjacent an electrode aperture, the curvature of each curved portion being in a first plane defined between the ion extraction axis and a second axis orthogonal thereto, the distance radially from a surface of the curved portion of the source electrodes to a surface of the curved portion of the extraction electrode being constant along at least a part of the length of each curved portion.

With prior art ion beam generators, the source and extraction electrodes both have the same radius of curvature. This means that, whilst the separation of the surfaces remains constant in a direction measured parallel to the ion extraction axis, the radial separation between the surfaces reduces from a maximum along the ion extraction axis to a minimum at the outer extremities of the source and extraction electrodes.

By contrast, by forming both the extraction and source electrode such that their separation in a radial direction is constant, the electrodes remain equidistant in the direction in which they focus a beam of ions exiting the ion source (i.e. towards the centre of their curvatures). With the arrangement of concentric electrodes provided by the present invention, an increase in ion beam current is obtainable.

The extraction electrode assembly may be either a triode structure, in which case the extraction electrode also acts as a suppression electrode, or may instead, and in the preferred embodiment, be a tetrode structure with a separate suppression electrode provided between the extraction electrode and the ground electrode. Most preferably, the curved portions of the source and extraction electrodes are part-cylindrical. In that case, a section through these curved portions will each define a part of a circle of different radius but with a common centre.

In accordance with a second aspect of the present invention, there is provided an ion beam generator for an ion implantation system, the ion beam generator comprising: an ion source for generating ions to be implanted; and an extraction electrode assembly comprising a plurality of electrodes for extracting and accelerating ions from the ion source; the extraction assembly including (a) a source electrode at the potential of the ion source; (b) an extraction electrode adjacent to the source electrode and at a potential different thereto, to extract ions along a first ion extraction axis; (c) a suppression electrode downstream of the extraction electrode along the ion extraction axis; and d) a ground electrode downstream of the suppression electrode and maintained in use at a ground potential; the source electrode and the extraction electrode being relatively movable in a direction generally parallel with the said first ion extraction axis.

Allowing a variation in the extraction gap between the source electrode and the extraction electrode permits the extracted beam current to be increased when necessary by decreasing the gap. When less beam current is required, the gap can be extended with the advantage of minimising the possibility of high voltage breakdown between the electrodes. The variable gap also provides the option of being able to modify the plasma boundary shape and, thereby, help tune the beam through the ion implanter.

According to a further aspect of the present invention, there is provided an ion beam generator for an ion implantation system, the ion beam generator comprising: an ion source for generating ions to be implanted; and an extraction electrode assembly comprising a plurality of electrodes for extracting and accelerating ions from the ion source; the extraction assembly including a source electrode at the potential of the ion source, an extraction electrode adjacent to the source electrode to extract ions from the ion source along a first extraction axis, and a ground electrode downstream of the extraction electrode in the said ion extraction direction; wherein the ion source includes an ion source front plate having a first part relatively distant from the ion extraction axis and a second part relatively adjacent to the ion extraction axis, the said first part being offset from the second part along the said ion extraction axis and wherein the said first part is downstream of the said second part such that the said second part forms a re-entrant surface.

Typically, the ion source of an ion beam generator for an ion implantation system employs either a directly or an indirectly heated cathode (IHC). For example, the directly heated Freeman and Bernas sources are well known. The internal structure of such sources requires that the front plate of the ion source is displaced, along the ion extraction axis.

By forming a re-entrant in the front face of the ion source, an aperture formed in the source electrode moves further toward the plasma generation region which in turn potentially allows more of the ion beam to be extracted. Furthermore, the re-entrant itself may be curved (i.e. concave) and this may improve beam focussing.

In still a further aspect of the present invention, there is provided an ion beam generator for an ion implantation system, the ion beam generator comprising: an ion source for generating ions to be implanted; and an extraction electrode assembly comprising a plurality of electrodes for extracting and accelerating ions from the ion source; the extraction assembly including (a) a source electrode at the potential of the ion source; (b) an extraction electrode adjacent to the source electrode and at a potential different thereto, to extract ions along a first ion extraction axis; and (c) an electrostatic lens comprising a lens electrode and a ground electrode, the lens being arranged downstream of the extraction electrode so as to control the focussing of ions there.

The use of an electrostatic lens provides more controllable focussing in both the horizontal and vertical plane, that is, in the two planes defined between the ion extraction axis and a first axis orthogonal thereto, and the ion extraction axis and the other axis orthogonal thereto, respectively.

In a preferred embodiment of an electrostatic lens, the lens electrode and ground electrode are concentric but axially offset cylinders, and in particular circular section cylinders. The ground electrode provides the inner cylinder and preferably includes a plurality of axially extending, radially displaced, slots. In a preferred embodiment, four slots may be provided which produce a quadrupole field, although dipole or other fields may be produced by, for example, altering the number of radially displaced slots. The electric field formed between the high tension outer cylinder (the lens electrode) and the grounded inner electrode (the ground electrode) penetrates the slots in the ground electrode so as to produce an electrostatic field.

In a particularly preferred embodiment, the extraction electrode assembly is a tetrode structure and further comprises a suppression electrode downstream of the extraction electrode along the extraction axis. It is of course to be understood that the lens can equally be employed in a triode structure.

BRIEF DESCRIPTION OF THE DRAWINGS

The invention may be put into practice in a number of ways, and some preferred embodiments will now be described by way of example and with reference to the accompanying drawings in which:

FIG. 4 shows, highly schematically, an isometric view of two of the electrodes of the ion beam generator and embodying still another aspect of the invention;

FIG. 8 shows a plot of electric equipotential lines, in plan view, for the arrangement of FIG. 7.

DETAILED DESCRIPTION OF THE PREFERRED EMBODIMENTS

Figure 1:
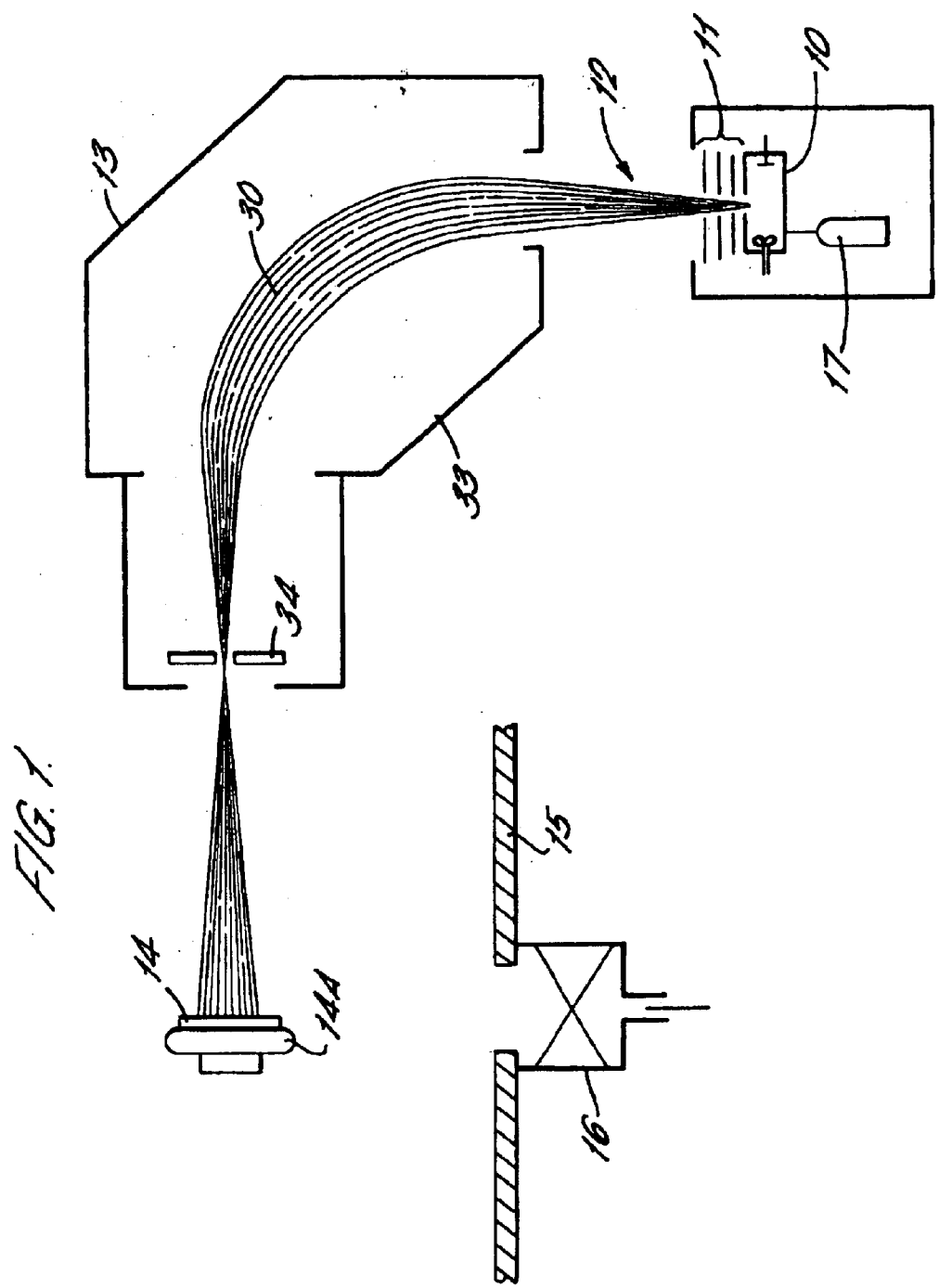
FIG. 1 shows a schematic view of an ion beam implanter incorporating an ion beam generator.

Referring to FIG. 1, an ion implanter apparatus comprises an ion beam source 10 with an extraction assembly 11, directing an ion beam 12 through an ion mass selector 13 to impinge upon a target substrate 14 mounted on a target substrate holder 14A. As is well known to workers in this field, the above elements of the ion implanter are housed in a vacuum housing of which a part 15 only is illustrated in FIG. 1. The vacuum housing may be evacuated by a vacuum pump 16.

The ion source 10 may comprise any known ion source such as a Freeman source or a Bernas source. The ion source 10 comprises an arc chamber to which is fed a supply of atoms of an element, or molecules containing that element, ions of which element are to be implanted in the target substrate 14. The molecules may be supplied to the arc chamber in gaseous or vapour form, e.g. from a gas bottle 17.

The extraction assembly 11, which will be described in further detail below, comprises a number of electrodes located immediately outside a front plate of the arc chamber of ion source 10 so as to extract ions from the arc chamber through an exit aperture in the front face.

The ion mass selector 13 illustrated in FIG. 1 comprises a magnetic sector mass analyser 33 operating in conjunction with a mass selecting slit 34. The magnetic analyser 33 comprises a region of uniform magnetic field in the direction perpendicular to the plane of the paper in FIG. 1. In such a magnetic field, all ions of the same velocity and having the same mass-to-charge ratio will describe circular paths of uniform radius. The radius of curvature of the path is dependent upon the mass-to-charge ratio of the ions, assuming uniform energy.

As is well known for such magnetic sector analysers, the geometry of such paths tends to bring a cone of ion paths emanating from an origin focus outside the entrance aperture of the analyser 33, back to a focus beyond the exit aperture of the analysers. The beam 30 is brought to a focus in the plane of the mass selection slit 34 beyond the exit aperture of the analyser.

In FIG. 1, the beam 30 is drawn showing only ions of a single mass/charge ratio, so that the beam comes to a single focus at the slit 34. This in turn allows the beam of ions of this mass/charge ratio to pass through the slit 34 towards the target substrate 14. In practice, the beam emitted by the ion source 10 will also contain ions of different mass/charge ratio from those desired for implantation in the substrate 14, and these undesired ions will be brought to a focus by the analyser 33 at a point in the plane of the slit 34 to either side of the position of the slit, and will therefore be prevented from travelling on towards the substrate. The analyser 33 thus has a dispersion plane in the plane of the drawing.

Figure 2:
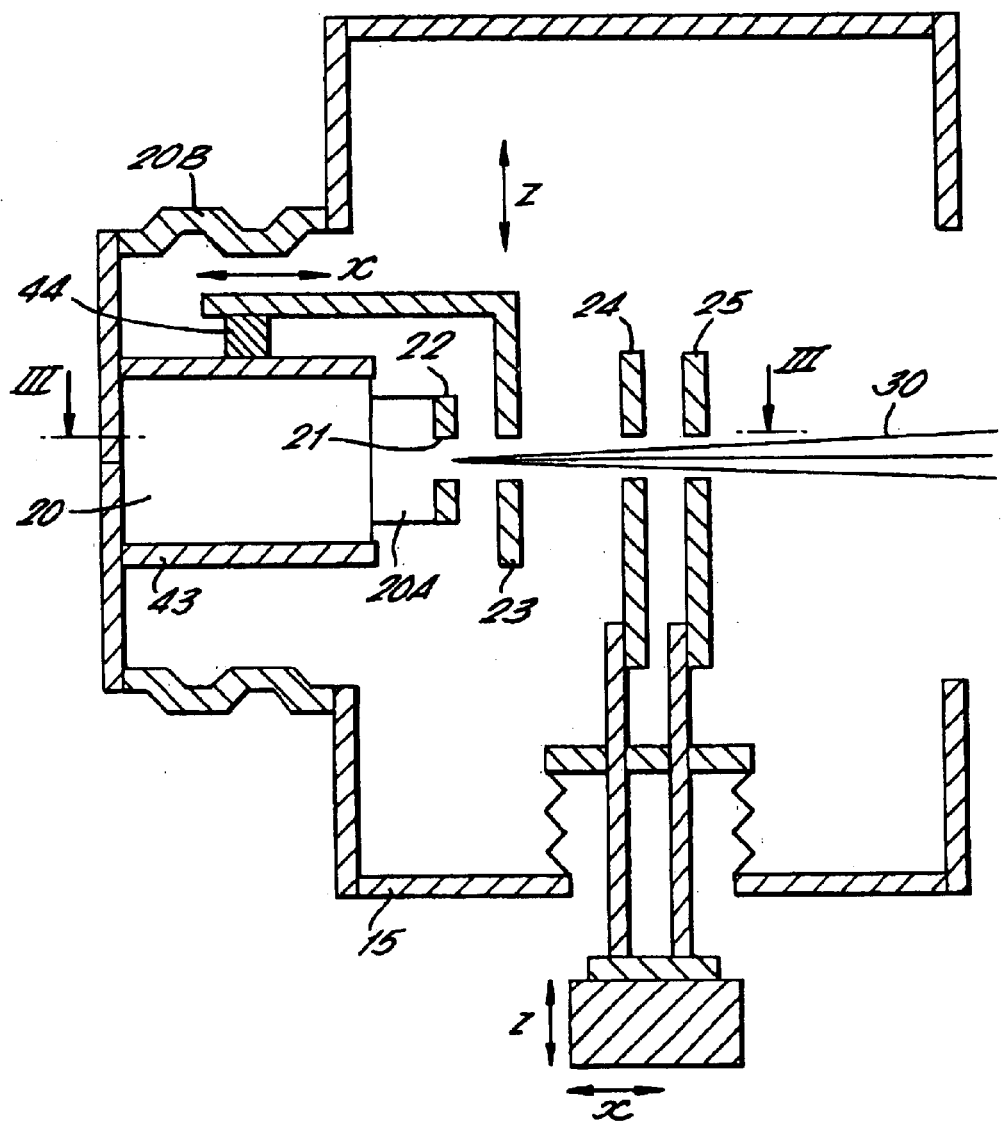
FIG. 2 shows a plan view of the ion beam generator of FIG. 1, in more detail and illustrating a first aspect of the invention.

Referring next to FIG. 2, the ion source and extraction assembly of FIG. 1 are shown, schematically, in further detail. The ion source 20 comprises an arc chamber 20A mounted to a housing 15 by arms 43. A bushing 20B acts as an insulator to isolate the ion source 20 from the remainder of the housing 15. Ions formed in the arc chamber 20A are extracted from the source 20 through an exit aperture 21 in a front face or plate 22 of the source. The front face 22 of the ion source forms a first apertured source electrode at the potential of the ion source forming part of the extraction assembly 11. (FIG. 1). The rest of the extraction assembly 11 is illustrated in FIG. 2 by extraction, suppression and ground-apertured electrodes 23, 24 and 25 respectively. Each of the apertured electrodes 23, 24 and 25 comprise a single electrically-conductive plate having an aperture through the plate to allow an ion beam 30 emerging from the ion source 20 to pass through. Each aperture has an elongate slot configuration with the direction of elongation being perpendicular to the plane in FIG. 2. This is better seen in FIG. 3, which is a section along the line III—III of FIG. 2.

For a beam of positive ions, the ion source 20 is maintained by a voltage supply at a positive voltage relative to ground. The energy of the ion beam emerging from the extraction assembly is determined by the voltage supplied to the ion source. A typical value for this voltage is 20 keV, providing an extracted beam energy 20 keV. However, extracted beam energies of 80 keV and higher, or 0.5 keV or lower may also be contemplated. To obtain higher or lower voltages, the source voltage is raised or lowered respectively.

The suppression electrode 24 is biassed by a voltage supply to a negative potential relative to ground. The negatively-biassed suppression electrode 24 operates to prevent electrons in the ion beam downstream of the ground electrode 25 (to the right in FIG. 2) from being drawn into the extraction region and into the ion source. As will be familiar to those skilled in the art, it is important to minimise the loss of electrons from the ion beam in zero electric field regions, so as to maintain ion beam neutralisation.

For a beam of positive ions, the extraction electrode 23 is maintained by a voltage supply at a potential below the potential of the ion source so as to extract the ions from that ion source. The potential of the extraction electrode 23 would typically be below the potential of the suppression electrode 24 for a low energy beam, and above the potential of the suppression electrode 24 for a high energy beam. In the former case, the beam will decelerate between the extraction and suppression electrodes, whilst in the latter case it will accelerate here.

As will be described further in connection with FIGS. 4 and 5, the extraction electrode 23 and source electrode 22 are curved so as to be concave facing away from the source 20.

The suppression and ground electrodes 24, 25 are mounted as shown in FIG. 2 so as to be movable in the beam direction as represented by the arrow X, and in a perpendicular direction as represented by arrow Z. This is described further in commonly assigned PCT Patent Application No. PCT/GB99/01977, published as WO 01/01438, the contents of which are incorporated herein by reference in their entirety.

In accordance with a first aspect of the present invention, the extraction electrode 23 is movable along the beam line, that is, in the direction x shown in FIG. 2. The extraction electrode 23 is mounted upon an insulating stand-off 44 which spaces the extraction electrode 23 from the ion source 20 and insulates it therefrom.

The location of the extraction electrode 23 may be adjusted manually, for example by means of a screwthread or the like, or may alternatively be remotely actuated by an actuator (not shown) which is connected to a computer (also not shown) which auto-tunes the ion beam by adjusting both the relative spacing of the extraction electrode 23 and source electrode 22, and also by adjusting the suppression and ground electrodes 24, 25.

It should be appreciated that, whilst adjustment of the extraction electrode position along the beamline is particularly desirable, adjustment of the extraction electrode in a perpendicular direction may additionally or alternatively be advantageous.

Figure 3:
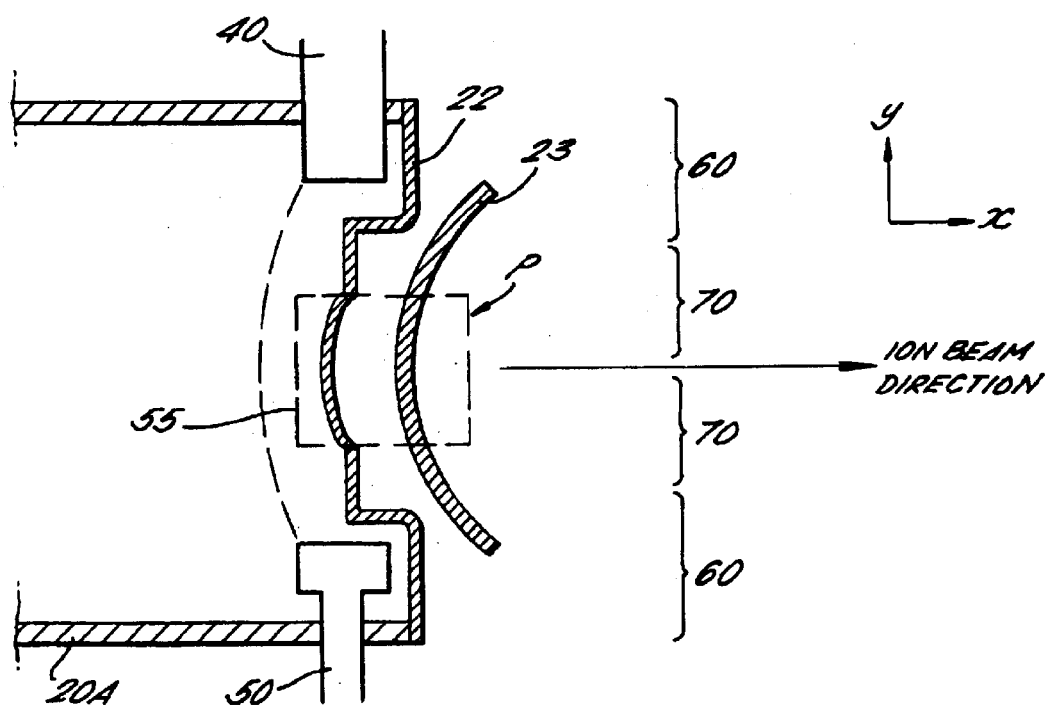
FIG. 3 shows a section along a part of the line III—III of FIG. 2, illustrating another aspect of the present invention.

Referring now to FIG. 3, a sectional view along the line III—III of a part of the ion source 20 is shown. In particular, the arc chamber 20A is shown along with the source and extraction electrodes 22, 23. A cathode 40 is provided to create a source of electrons and these are reflected by an anti-cathode 50. The electrons ionise elements of a material to be implanted. The plasma region thus created is shown generally at 55. As will be familiar to those skilled in the art, a magnetic field may also be employed to confine the plasma.

In accordance with a further aspect of the invention, the front face plate 22 of the ion source 20 is re-entrant. A first region 60 is spaced from the cathode 40 and anti-cathode 50 in the direction of the ion beam as shown in FIG. 3. A second region 70 is in a plane relatively closer to the plasma region 55 and it is this second region 70 which contains the exit aperture 21. Thus, viewed face-on, the front face or plate 22 of the ion source 20 contains an indent surrounding the exit aperture 21. It will of course be appreciated that, whilst the indent or re-entrant in the region 70 extends inwardly of the ion source 20 in the x-direction (that is, in the opposite direction to the ion beam), it may extend also only in one further, orthogonal direction so as to form a channel around the exit aperture, or it may extend in all three dimensions so as to form a rectangular, square, circular or other shaped recess. With this arrangement, the exit aperture 21 (FIG. 2), defined by an opening in the second region 70 of the source electrode 22 is moved closer to plasma region 55L which improves ion extraction efficiency.

Turning now to FIG. 4, a schematic isometric projection of that part of the source electrode 22 which is adjacent to the aperture 21 is shown, along with the corresponding part of the extraction aperture 22. It may be seen from FIG. 4 that both electrodes (and the apertures or slits in them) are curved in the x-y plane and are concave towards the ion source. In the embodiment of FIG. 4, the electrodes are linear in the x-z plane so that each of the source and extraction electrodes 22, 23 form a part of a cylinder. However, other configurations, for example where the electrodes are curved in the x-z plane as well, so as to form a part of a sphere, for example, are contemplated. Alternatively, generally cylindrical electrodes which are curved substantially only in the x-z plane could be used.

Figure 5A:
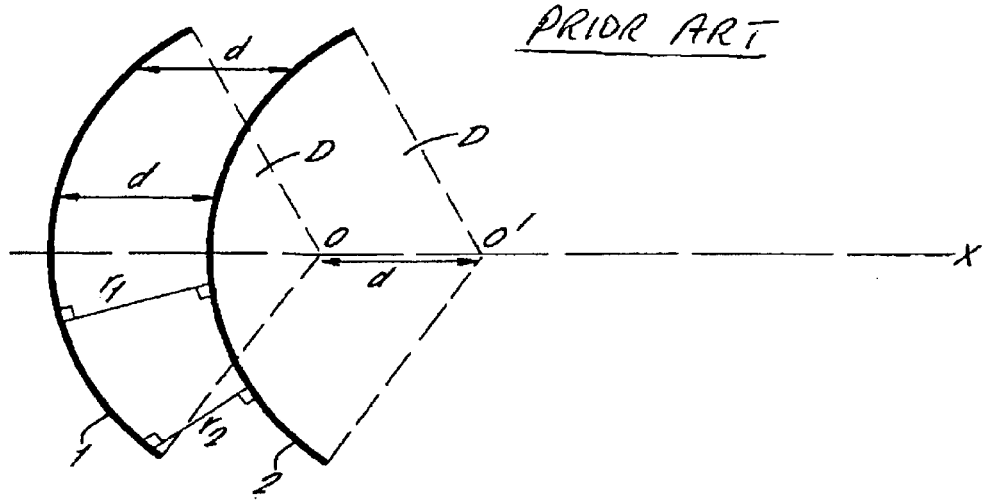
FIG. 5a shows, in schematic sectional view, two electrodes of a prior art ion beam generator.
Figure 5B:
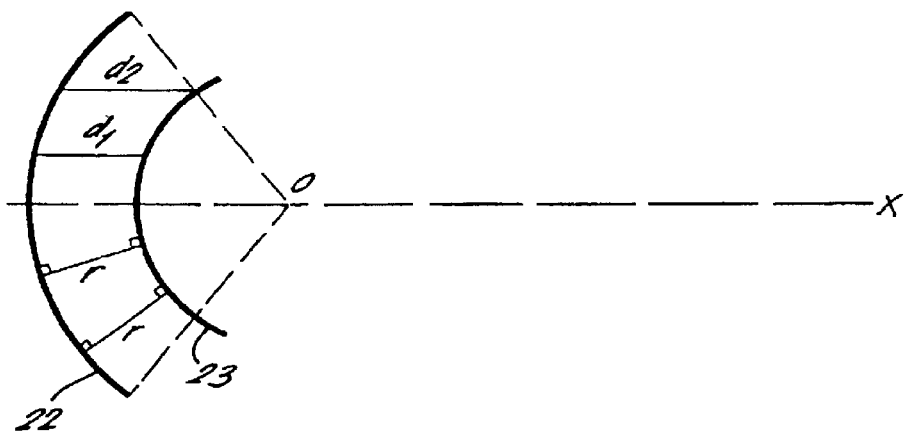
FIG. 5b shows the region P of FIG. 3 which is a schematic close up sectional view of a part of the two electrodes of FIG. 4, and which embody an aspect of the present invention.

The specific geometry of the source and extraction electrodes 22, 23 may be understood by reference to FIGS. 5a and 5b. FIG. 5a shows, in plan view and again schematically, the arrangement of source and extraction electrodes 1, 2 respectively in a prior art extraction electrode assembly. It will be seen that each electrode in FIG. 5a forms, in plan view, a part of a circle of equal diameter D, but with a centre O of the notional circle of which the source electrode 1 forms a part being offset from the centre O' of the notional circle of which the extraction electrode forms a part, by a distance d. This means that the separation of the source and extraction electrodes 1, 2 is a constant distance d in a direction measured parallel with the ion beam axis X. However, the separation in a radial direction decreases away from the ion beam axis X such that a first radial separation $r_1$, adjacent the beam axis X, is larger than a second radial separation $r_2$ away from the beam axis X.

A preferred embodiment of the configuration of source and extraction electrodes in accordance with a preferred embodiment of the present invention is shown in FIG. 5b.

Here, the source electrode and the extraction electrode each have radii such that their curvature are concentric about a common point O. Thus, the radial separation of the two electrodes 22, 23 is constant. The axial separation, in a direction parallel with the ion beam axis X thus increases away from the axis such that $d_1$ is less than $d_2$ as seen in FIG. 5b. The advantage of this is that the electrodes in FIG. 5b are equidistant in the direction in which they focus the beam, that is, towards the centre of their curvatures. This arrangement results in an increase in ion beam current.

Although a circular section is shown in FIG. 5b for ease of explanation, it is to be understood that any suitable shape can be employed. For example, in section, each of the source and extraction electrodes may form a part of an ellipse or a hyperbola or any other shape. All that is necessary is that a line passing through the source and extraction electrodes at right-angles to each is of constant length regardless of where around each electrode this line is drawn. The focal point O of the electrodes is not critical but in any event is typically many centimeters downstream of the source and extraction electrodes along the beamline direction.

Figure 6:
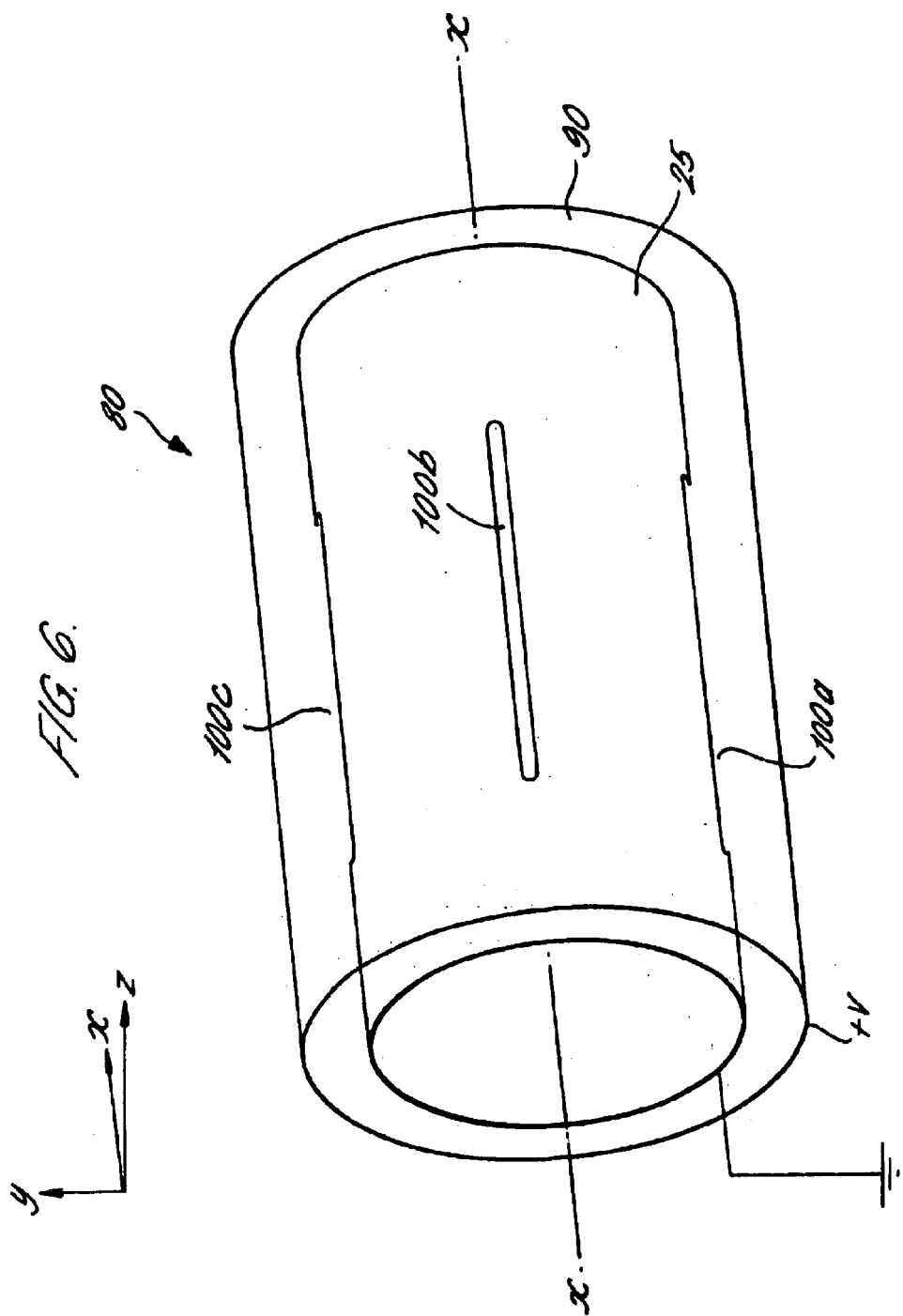
FIG. 6 shows a schematic isometric view of an electrostatic lens embodying a fourth aspect of the present invention.
Figure 7:
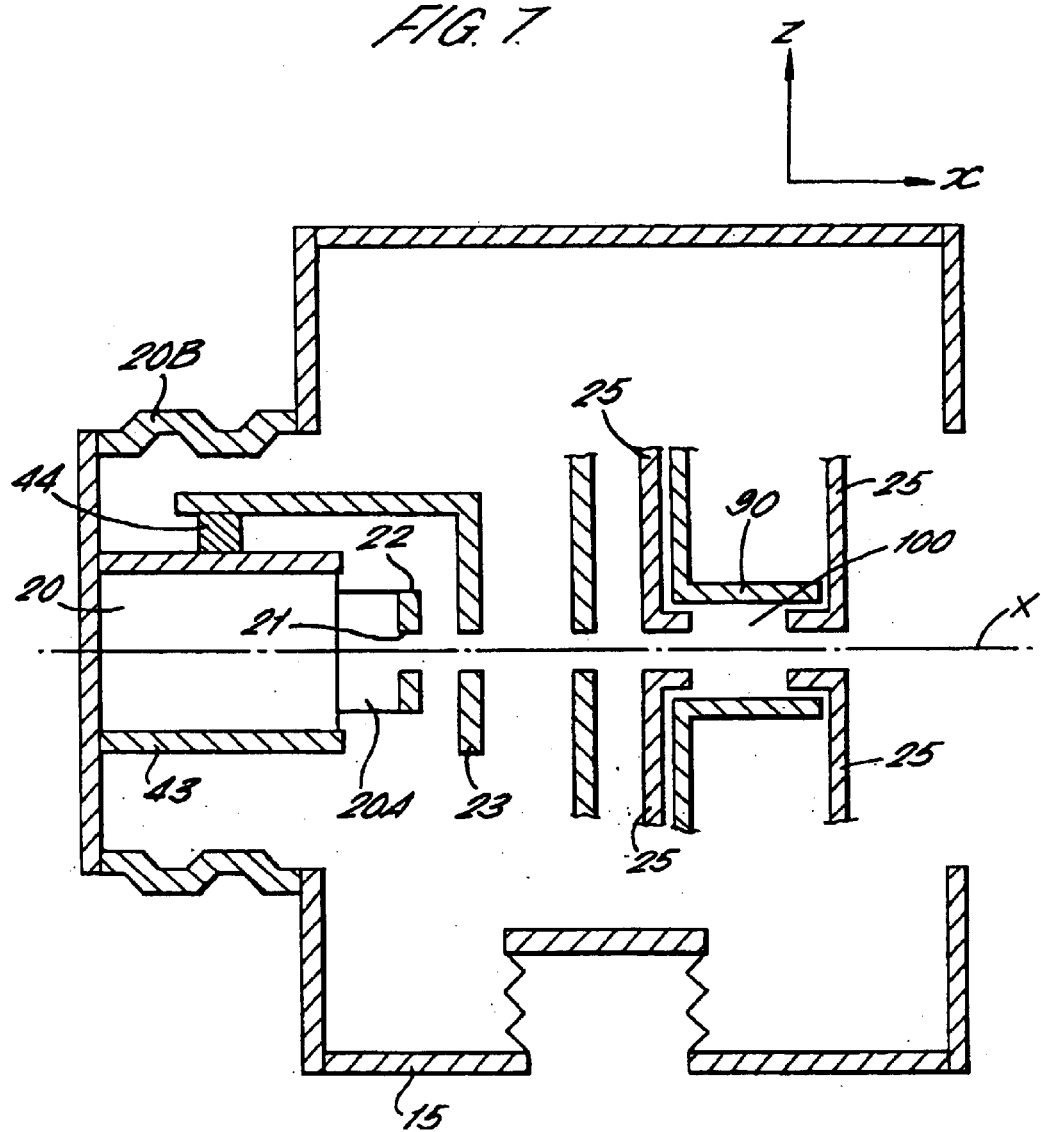
FIG. 7 shows a plan view of an ion beam generator similar to that shown in FIG. 2, including the electrostatic lens of FIG. 6.

Turning now to FIG. 6, a schematic, isometric view of an electrostatic lens 80 for use with an electrode extraction assembly is shown. FIG. 7 shows, in plan view, the tetrode structure of FIG. 2 but with the generally planar ground electrode now formed as a part of the lens of FIG. 6, as explained further below. Means for moving the suppression electrode (shown in FIG. 2) may be employed in the arrangement of FIG. 7 but is not shown in FIG. 7 for the sake of clarity.

As seen in FIG. 6, the electrostatic lens 80 comprises two cylinders (each of which is preferably of circular section) of different diameters, which are each coaxial about the ion beam axis x. The inner cylinder provides the ground electrode 25 of the previous Figures. The outer cylinder 90 forms a lens electrode. It will appreciated that the electrodes of the lens could instead be generally planar.

A plurality of slots 100a, 100b, 100c extend through the wall of the cylindrical ground electrode 25 and are elongate in the axial, ion beam direction. In FIG. 6, there are four slots (although only three are visible in the projection shown) and these are equidistantly spaced around the ground electrode 25.

The lens electrode 90 is supplied in use with a high voltage (typically 1 kV or so) and the potential difference between the inner and outer cylinders of the electrostatic lens 80 penetrates through the four slots 100 so as to produce an electrostatic quadrupole. Although the lens of FIG. 6 has four slots which together form a quadrupole, it is to be understood that more or fewer slots can be used to create, for example, dipole or octupole lenses.

The lens of FIG. 6 may be used to control ion beam focussing in both the horizontal (Z-axis) and vertical (Y-axis) directions.

FIG. 8 shows equipotentials for the arrangement of FIG. 7. The components of the inner and outer cylinders of the electrostatic quadrupole lens 80 which extend in the Z-direction in FIG. 7 act as screening plates and may be omitted but in any event are not shown in FIG. 6 for the sake of clarity.

Although the foregoing embodiments have largely been described in connection with a tetrode structure which is currently preferred, it is to be understood that in particular the use of a re-entrant source electrode, concentric source and extraction electrodes and an electrostatic quadrupole can equally be employed with a triode structure. Various other modifications will be apparent to those skilled in the art, and the scope of the present invention is thus to be determined solely with reference to the accompanying claims.

We claim:

1. An ion beam generator for an ion implantation system, the ion beam generator comprising:

an ion source for generating ions to be implanted; and an extraction electrode assembly comprising a plurality of electrodes for extracting and accelerating ions from the ion source;

the extraction assembly including a source electrode at a potential of the ion source, an extraction electrode adjacent to the source electrode to extract ions from the ion source along a first ion extraction axis, and a ground electrode downstream of the extraction electrode along said first ion extraction axis;

wherein the source electrode and the extraction electrode each have a curved portion adjacent an electrode aperture, a curvature of each curved portion being in a first plane defined between the first ion extraction axis and a second axis orthogonal thereto, a distance radially from a surface of the curved portion of the source electrode to a surface of the curved portion of the extraction electrode being constant over at least a part of the each said curved portion.

2. The ion beam generator of claim 1, in which the curved portions of the source electrode and the extraction electrode are each further curved in a second plane defined between the first ion extraction axis and a third axis orthogonal to both the first ion extraction axis and said second axis.

3. The ion beam generator of claim 1, wherein the curved portions of the source and extraction electrode each define an arc of a circle, the centre radius of the arc defined by the curved portion of the source electrode being coincident with the centre of radius of the arc defined by the curved portion of the extraction electrode.

4. The ion beam generator of claim 1, wherein the extraction assembly is a tetrode arrangement, the extraction assembly further comprising a suppression electrode between said extraction electrode and said ground electrode.

5. The ion beam generator of claim 1, wherein the ion source has a source front plate including a first part relatively distant from the first ion extraction axis and a second part relatively adjacent the first ion extraction axis and including said curved portion of the source electrode;

wherein said first part is offset from the second part along said ion extraction axis, and wherein said first part is, downstream of said second part such that said second part forms a re-entrant surface.

6. The ion beam generator of claim 5, wherein the first part of the source front plate extends generally in a third plane defined by axes each perpendicular to the first ion extraction axis, and the second part of the source front plate extends generally in a fourth plane parallel with the third plane but spaced therefrom in a direction of the first ion extraction axis.

7. The ion beam generator of claim 1, further comprising an electrostatic lens arranged to control ions downstream of the extraction electrode.

8. The ion beam generator of claim 7, wherein the electrostatic lens is formed from the ground electrode and a lens electrode, the lens electrode being located radially outwardly of the ground electrode and being supplied with a non-zero potential relative to ground in use.

9. The ion beam generator of claim 8, wherein the lens electrode and ground electrode each have a cylindrical portion, the cylindrical portion of the lens electrode being coaxial with the cylindrical portion of the ground electrode along the first ion extraction axis.

10. The ion beam generator of claim 9, wherein the diameter of the cylindrical portion of the lens electrode is greater than the diameter of the cylindrical portion of the ground electrode, and wherein the ground electrode includes a plurality of axially extending, radially displaced slots in the cylindrical portion thereof.

11. An ion beam generator for an ion implantation system, the ion beam generator comprising:
   an ion source for generating ions to be implanted; and
   an extraction electrode assembly comprising a plurality of electrodes for extracting and accelerating ions from the ion source;
   the extraction assembly including:
      (a) a source electrode at a potential of the ion source;
      (b) an extraction electrode adjacent to the source electrode and at a potential different thereto, to extract ions along a first ion extraction axis;
      (c) a suppression electrode downstream of the extraction electrode along the first ion extraction axis; and
      (d) a ground electrode downstream of the suppression electrode and maintained in use at a ground potential;
   the source electrode and the extraction electrode being relatively movable in a direction generally parallel with and/or perpendicular to said first ion extraction axis.

12. An ion beam generator for an ion implantation system, the ion beam generator comprising:
   an ion source for generating ions to be implanted; and
   an extraction electrode assembly comprising a plurality of electrodes extracting and accelerating ions from the ion source;
   the extraction assembly including a source electrode at a potential of the ion source, an extraction electrode adjacent the source electrode to extract ions from the ion source along a first extraction axis, and a ground electrode downstream of the extraction electrode along said ion extraction axis;
   wherein the ion source includes an ion source front plate having a first part relatively distant from the first ion extraction axis and a second part relatively adjacent the first ion extraction axis,
   said first part being offset from the second part along said ion first extraction axis and wherein said first part is downstream of said second part such that said second part forms a re-entrant surface.

13. The ion beam generator of claim 12, wherein the extraction electrode assembly is a tetrode extraction electrode assembly which further includes a suppression electrode between the extraction electrode and the ground electrode.

14. An ion beam generator for use in an ion implantation system having an ion mass selector for selecting from ions generated by the ion beam generator desired ions for implantation, the ion beam generator comprising:
   an ion source for generating ions to be implanted;
   an extraction electrode assembly comprising a plurality of electrodes for extracting and accelerating ions from the ion source for transmission, in use, to the ion mass selector;
   the extraction assembly including
      (a) a source electrode at a potential of the ion source;
      (b) an extraction electrode adjacent the source electrode and at a potential different thereto, to extract ions along a first ion extraction axis; and
      (c) an extraction lens comprising a lens electrode and a ground electrode, the lens being arranged downstream of the extraction electrode so as to control focusing of ions there.

15. The ion beam generator of claim 14, wherein the electrostatic lens is supplied with a non-zero potential relative to ground in use.

16. The ion beam generator of claim 15, wherein the lens electrode and ground electrode each have a cylindrical portion, the cylindrical portion of the lens electrode being coaxial with the cylindrical portion of the ground electrode along the first ion extraction axis.

17. The ion beam generator of claim 16, wherein a diameter of the cylindrical portion of the lens electrode is greater than a diameter of the cylindrical portion of the ground electrode, and wherein the ground electrode includes a plurality of axially extending, radially displaced slots in the cylindrical portion thereof.

18. The ion beam generator of claim 14, further comprising a suppression electrode arranged between the said extraction electrode and the said electrostatic lens along the first ion extraction axis.

19. An ion implanter for implanting ions into a semiconductor wafer, said ion implanter having an ion beam generator comprising:
   an ion source for generating ions to be implanted; and
   an extraction electrode assembly comprising a plurality of electrodes for extracting and accelerating ions from the ion source;
   the extraction assembly including a source electrode at a potential of the ion source, an extraction electrode adjacent to the source electrode to extract ions from the ion source along a first ion extraction axis, and a ground electrode downstream of the extraction electrode along said ion extraction axis;
   wherein the source electrode and the extraction electrode each have a curved portion adjacent an electrode aperture, a curvature of each curved portion being in a first plane defined between the first ion extraction axis and a second axis orthogonal thereto, a distance radially from a surface of the curved portion of the source electrode to a surface of the curved portion of the extraction electrode being constant over at least a part of each said curved portion.

20. An ion implanter for impanting ions into a semiconductor wafer, said ion implanter having an ion beam generator comprising:
   an ion source for generating ions to be implanted; and
   an extraction electrode assembly comprising a plurality of electrodes for extracting and accelerating ions from the ion source;
   the extraction assembly including:
      (a) a source electrode at a potential of the ion source;
      (b) an extraction electrode adjacent to the source electrode and at a potential different thereto, to extract ions along a first ion extraction axis;
      (c) a suppression electrode downstream of the extraction electrode along the first on the extraction axis; and
      (d) a ground electrode downstream of the suppression electrode and maintained in use at a ground potential;
   the source electrode and the extraction electrode being relatively movable in a direction generally parallel with and/or perpendicular to said first ion extraction axis.

21. An ion implanter for implanting ions into a semiconductor wafer, said ion implanter having an ion beam generator comprising:

an ion source for generating ions to be implanted; and an extraction electrode assembly comprising a plurality of electrodes for extracting and accelerating ions from the ion source;

the extraction assembly including a source electrode at a potential of the ion source, an extraction electrode adjacent the source electrode to extract ions from the ion source along a first extraction axis, and a ground electrode downstream of the extraction electrode along said ion extraction axis;

wherein the ion source includes an ion source front plate having a first part relatively distant from the first ion extraction axis and a second part relatively adjacent the first ion extraction axis, said first part being offset from the second part along said first ion extraction axis and wherein said first part is downstream of said second part such that said second part forms a re-entrant surface.

22. An ion implanter for implanting ions into a semiconductor wafer, said ion implanter having an ion beam generator and an ion mass selector for selecting from ions generated by the ion beam generator desired ions for implantation;

the ion beam generator comprising:
    an ion source for generating ions to be implanted;
    an extraction electrode assembly comprising a plurality of electrodes for extracting accelerating ions from the ion source, for transmission, in use, to the ion mass selector;

the extraction assembly including:
    (a) a source electrode at a potential of the ion source;
    (b) an extraction electrode adjacent the source electrode and at a potential different thereto, to extract ions along a first ion extraction axis; and
    (c) an electrostatic lens comprising a lens electrode and a ground electrode, the lens being arranged downstream of the extraction electrode so as to control focusing of ions.

* * * * *